(12) United States Patent
Fan et al.

(10) Patent No.: US 7,982,533 B2
(45) Date of Patent: Jul. 19, 2011

(54) TRANSCEIVING SYSTEM AND COMPOUND FILTER

(75) Inventors: Yiping Fan, Fremont, CA (US);
Chieh-Yuan Chao, Fremont, CA (US)

(73) Assignee: Mediatek USA Inc., San Jose, CA (US)

( * ) Notice: Subject to any disclaimer, the term of this patent is extended or adjusted under 35 U.S.C. 154(b) by 972 days.

(21) Appl. No.: 11/853,072

(22) Filed: Sep. 11, 2007

(65) Prior Publication Data
US 2008/0002597 A1    Jan. 3, 2008

Related U.S. Application Data

(63) Continuation-in-part of application No. 11/209,912, filed on Aug. 22, 2005, now abandoned.

(60) Provisional application No. 60/826,222, filed on Sep. 20, 2006.

(51) Int. Cl.
*H03K 5/00* (2006.01)

(52) U.S. Cl. ........ 327/553; 327/552; 327/558; 327/559; 455/73

(58) Field of Classification Search .......... 327/551–559, 327/113–115; 455/73, 272
See application file for complete search history.

(56) References Cited

U.S. PATENT DOCUMENTS

| | | | |
|---|---|---|---|
| 4,501,018 A * | 2/1985 | Shanley et al. | 455/83 |
| 5,694,419 A | 12/1997 | Lawrence et al. | |
| 6,377,788 B1 | 4/2002 | Elder et al. | |
| 6,466,613 B1 * | 10/2002 | Raphaeli et al. | 375/219 |
| 6,657,483 B1 | 12/2003 | Sahu | |
| 6,728,517 B2 * | 4/2004 | Sugar et al. | 455/73 |
| 6,803,813 B1 | 10/2004 | Pham | |
| 6,891,414 B1 | 5/2005 | Bunch et al. | |
| 6,993,310 B2 | 1/2006 | Magnusen et al. | |
| 7,031,669 B2 * | 4/2006 | Vaidyanathan et al. | 455/84 |
| 7,116,159 B2 | 10/2006 | Fleischhacker et al. | |
| 7,463,864 B2 * | 12/2008 | Vassiliou et al. | 455/73 |
| 7,636,554 B2 * | 12/2009 | Sugar et al. | 455/73 |
| 2005/0048928 A1 | 3/2005 | Jeon et al. | |

FOREIGN PATENT DOCUMENTS

| | | |
|---|---|---|
| CN | 1328723 | 12/2001 |
| CN | 1677882 | 10/2005 |

OTHER PUBLICATIONS

English language translation of abstract of CN 1328723 (published Dec. 26, 2001).
English language translation of abstract of CN 1677882 (published Oct. 5, 2005).
"An Integrated 52GHz CMOS T/R Switch with LC-tuned Substrate Bias" Talwalkar, et al., 2003.

* cited by examiner

*Primary Examiner* — Dinh T. Le
(74) *Attorney, Agent, or Firm* — Thomas|Kayden

(57) ABSTRACT

A transceiving system utilizing a shared filter module is provided. The shared filter module is selectively filtering signals in a first band in a first mode and a second band in a second mode. The first mode is a receiver mode whereas the second mode is a transmission mode. The shared filter module comprises a compound filter comprising two low pass filters and a coupling controller to manage input and output wiring of the low pass filters. When the coupling controller is enabled in the first mode, the compound filter acts as a bandpass filter. When the coupling controller is disabled, the compound filter acts as two independent low pass filters.

21 Claims, 6 Drawing Sheets

TRANSCEIVING SYSTEM AND COMPOUND FILTER

CROSS REFERENCE TO RELATED APPLICATIONS

This application is a Continuation-In-Part of pending U.S. patent application Ser. No. 11/209,912, filed Aug. 22, 2005 and entitled "SHARED RECEIVER AND TRANSMITTER FILTER", and this application claims the benefit of Provisional application Ser. No. 60/826,222, filed Sep. 20, 2006 and entitled "BANDPASS AND LOWPASS FILTER SHARING IN LIF AND ZIF TRANSCEIVER ARCHITECTURE".

BACKGROUND OF THE INVENTION

1. Field of the Invention

The invention relates to a sharable filter in a transceiver, and more particularly, to a flexible filter structure switching between different passbands on demand.

2. Description of the Related Art

Filter design plays a very important role in communication systems. An ideal receiver channel filter can minimize signal distortion by maximizing signal to noise ratio, rejecting out-of-band interference and limiting the noise bandwidth to a satisfactory level. The goal of less distortion, however, conflicts with the design goal of providing more rejection of noise and interference. Thus, receiver filters are always burdened with undesirable trade-offs.

FIG. 1 shows a conventional direct conversion transceiver 100. When in receiver mode, inbound RF signal RFIN is received and amplified by a low noise amplifier (LNA) 102, and a first mixer 104I and a second mixer 104Q individually render mixer results #Iin and #Qin that are then filtered in the low pass filters (LPF) 106I and 106Q. Thereafter, filter results RXI and RXQ are output for further procedures in an analog to digital converter (ADC) unit (not shown). Conversely, when in transmission mode, outbound baseband signals TXI and TXQ are individually provided to the LPF 110I and 110Q. Filter results #IOUT and #QOUT are then mixed in the first up converter 112I and second up converter 112Q, and a combination result is sent to the variable gain amplifier (VGA) 114 for gain adjustment, and the power amplifier 116 transmits the outbound RF signal RFOUT after performing power amplification.

Among the LPFs 106I, 106Q, 110I and 110Q, the most important parameter is filter bandwidth. In a typical communication system, the transmitter LPFs 110I and 110Q are designed to achieve wider bandwidth than that of the receiver LPFs 106I and 106Q. However, LPFs of different bandwidth parameters are redundantly implemented in one transceiver, causing significant waste of chip area and costs. As known, filters consume significant chip area and power, which is undesirable for most recent 3C applications of which compactness and power efficiency are basic requirements. Therefore, a new filter architecture to eliminate redundancies of components in a transceiver is desirable.

BRIEF SUMMARY OF THE INVENTION

An exemplary embodiment of a transceiving system is provided. An enhanced shared filter module is provided. The shared filter module selectively filtering signals in a first band in a first mode and a second band in a second mode. The first mode is a receiver mode whereas the second mode is a transmission mode. The shared filter module comprises a compound filter comprising two low pass filters and a coupling controller to manage input and output wiring of the low pass filters. When the coupling controller is enabled in the first mode, the compound filter acts as a bandpass filter. When the coupling controller is disabled, the compound filter acts as two independent low pass filters.

Preferably, the compound filter is a ladder structure comprising a plurality of filter cells cascaded in series. In a filter cell, a first operational amplifier is disposed on an inphase channel, comprising a pair of differential input ends and output ends. A second operational amplifier is disposed on a quadrature channel, comprising a pair of differential input ends and output ends. A first coupling controller is associated to a negative input end of the first operational amplifier and a negative output end of the second operational amplifier. A second coupling controller is associated to a positive input end of the first operational amplifier and a positive output end of the second operational amplifier. A third coupling controller is associated to a positive input end of the second operational amplifier and a positive output end of the first operational amplifier. A fourth coupling controller is associated to a negative input end of the second operational amplifier and a negative output end of the first operational amplifier. In the first mode, the first, second, third and fourth coupling controllers are enabled, and the compound filter acts as a bandpass filter. In the second mode, the first, second, third and fourth coupling controllers are disabled, electronically isolating the first and the second operational amplifiers, forming two individual low pass filters.

More specifically, the first coupling controller comprises a first resistor serially cascaded with a first switch, the second coupling controller comprises a second resistor serially cascaded with a second switch, the third coupling controller comprises a third resistor serially cascaded with a third switch, and the fourth coupling controller comprises a fourth resistor serially cascaded with a fourth switch. The first, second, third and fourth switches are simultaneously closed in the first mode, and opened in the second mode.

As an example, the first mode maybe a receiver mode. When in the first mode, the shared filter module acts as a bandpass filter, such that the transceiving system acts as a low intermediate frequency (LIF) receiver. When in the second (transmission) mode, the shared filter module acts as a low pass filter that passes the second band, such that the transceiving system acts as a direct conversion transmitter.

The disclosed transceiving system is particularly adoptable for Time Division Multiple Access (TDMA) communication systems where transmission and reception do not occur at the same time, comprising Wireless Local Area Network, Bluetooth and GSM systems. A detailed description is given in the following embodiments with reference to the accompanying drawings.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
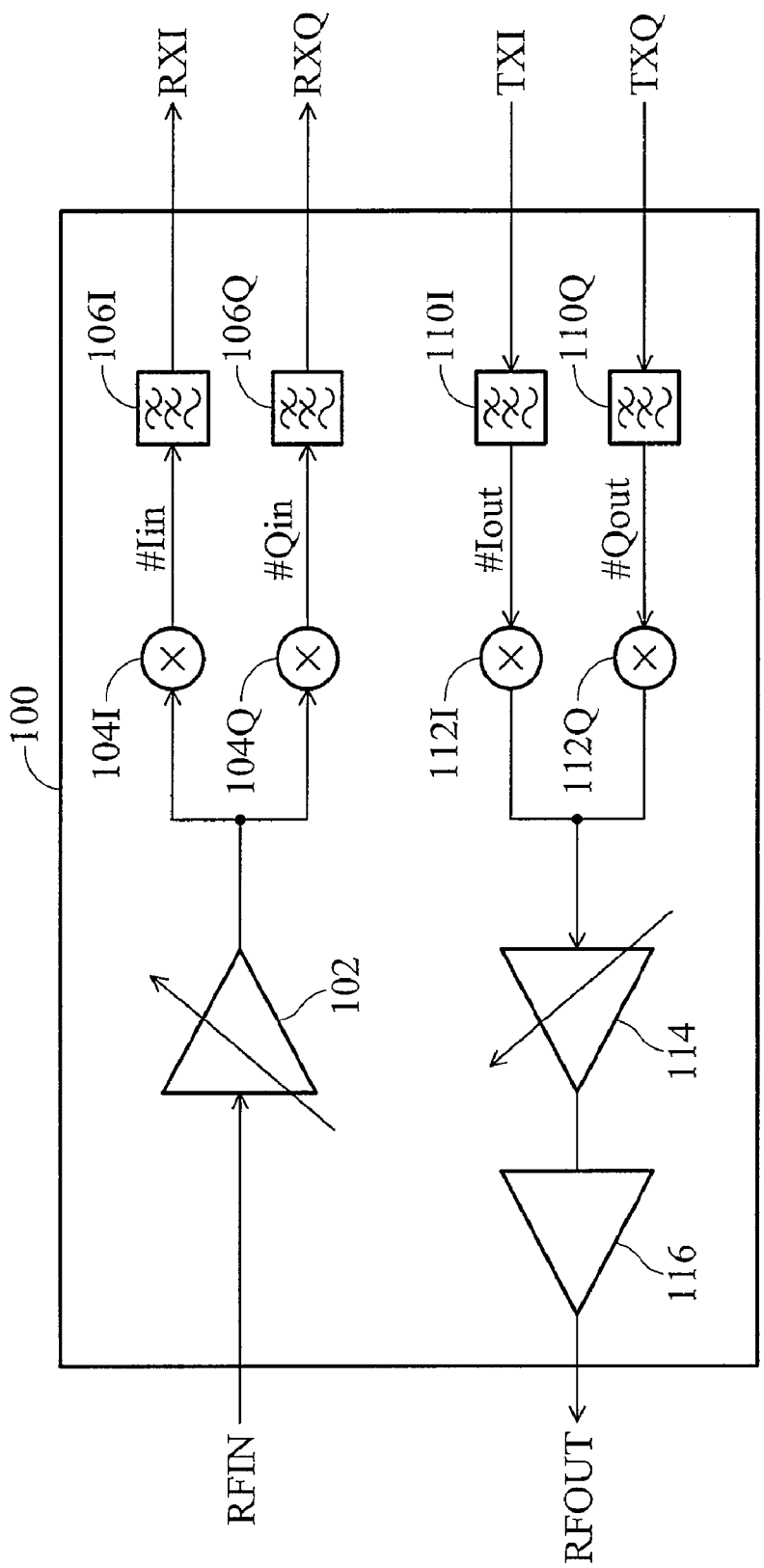
FIG. 1 shows a conventional direct conversion transceiver 100.
Figure 2:
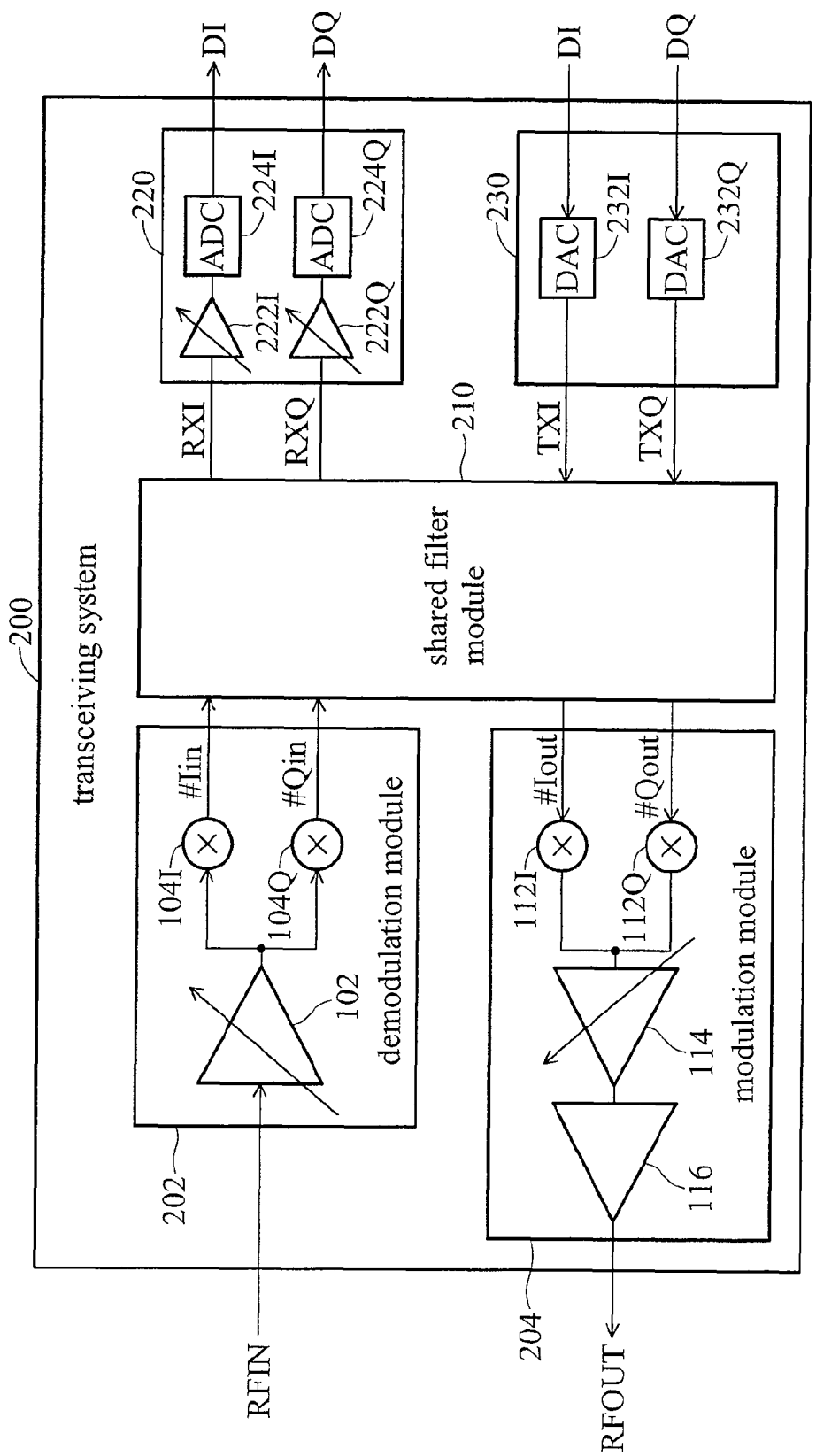
FIG. 2 shows an embodiment of a transceiving system 200 comprising a shared filter module 210 for both reception and transmission.

FIG. 2 shows an embodiment of a transceiving system 200 comprising a shared filter module 210 for both data reception and transmission. Instead of adopting the conventional filters 106I, 106Q, 110I and 110Q shown in FIG. 1, the embodiment of the present invention utilizes one shared filter module 210 for both receiver mode and transmission mode. The demodulation module 202 comprises a LNA 102, first and second mixers 104I and 104Q which have the same function as FIG. 1. When in receiver mode, inbound RF signal RFIN is received by the demodulation module 202, and mixer results #Iin and #Qin are individually rendered as inputs to the shared filter module 210. Thereafter, the filter results RXI and RXQ are output for further procedures in a baseband module 220. Specifically, the baseband module 220 may comprise a first VGA 222I and a second VGA 222Q, each performing gain adjustments for the filter results RXI and RXQ. A first ADC 224I and a second ADC 224Q are individually coupled to the outputs of the first VGA 222I and second VGA 222Q with digital data outputs DI and DQ respectively. The analog converter module 230 comprises first DAC 232I and second DAC 232Q to generate outbound baseband signals TXI and TXQ from outbound data DI and DQ respectively. When the transceiving system 200 operates in transmission mode, the outbound baseband signals TXI and TXQ are sent to the shared filter module 210. Mixer results #IOUT and #QOUT are then output and sent to a modulation module 204. The modulation module 204 comprises a first up converter 112I, second up converter 112Q, VGA 114 and power amplifier 116 as FIG. 1, in which mixing, combination and amplification procedures are performed to generate the outbound RF signal RFOUT for transmission. In this case, a shared filter module 210 is shown as a basis for the further embodiments below.

Figure 3:
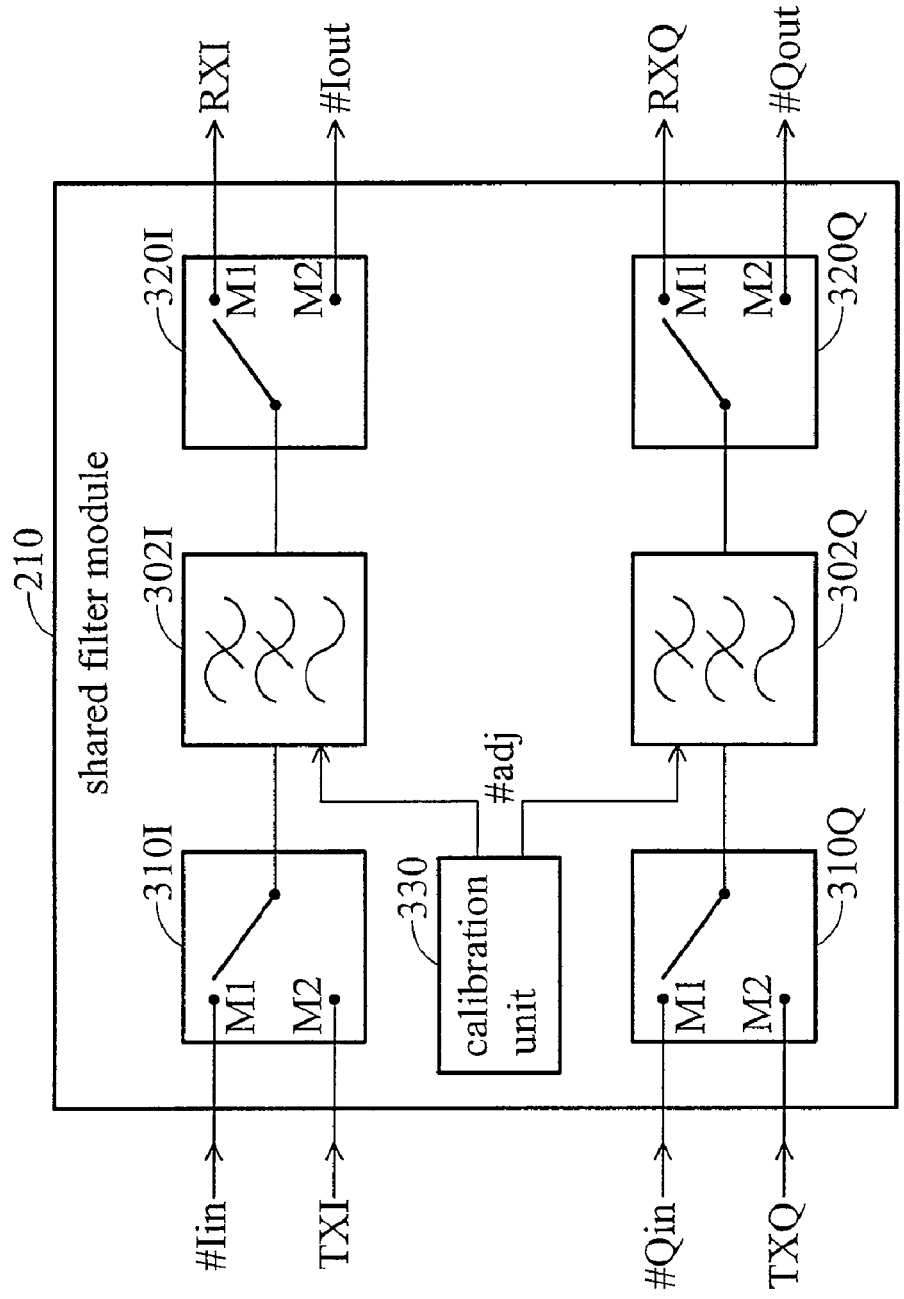
FIG. 3 shows an embodiment of a shared filter module 210 according to the previously filed application.

FIG. 3 shows an embodiment of a shared filter module 210 according to the previously filed application. In the shared filter module 210, four selectors 310I, 310Q, 320I and 320Q are utilized to determine data paths for different modes. LPFs 302I and 302Q are used for both transmitter and receiver modes. A direct conversion transmitter is also referred to as a zero intermediate frequency (ZIF) transmitter. For a typical ZIF transceiver particularly used in TDMA communication systems, such as WLAN (IEEE 802.11 standard) or Bluetooth, the bandwidth parameter for both modes may have some differences. For example, a receiver requires a 9 MHz filter whereas a transmitter requires a 11 Mhz filter. Since the two modes do not occur at the same time for TDMA applications, a calibration unit 330 may be used to adjust the bandwidths of LPFs 302I and 302Q to adopt for either mode. The adjustment may be accomplished by tuning the time constants of the RC circuits in the LPFs 302I and 302Q. A known approach is to provide a so called capacitor bank that may increase or decrease the filter bandwidth by simply shorting or opening the capacitor bank circuits. Detailed introduction of the bandwidth adjustment and calibration is already given in the previously filed application, thus is not further described herein.

When the shared filter module 210 operates in receiver mode, the switches in the selectors 310I, 320I, 310Q and 320Q create conducted paths through the node M1. Consequently, Mixer results #Iin and #Qin from the demodulation module 202 are sent to the LPFs 302I and 302Q, and filter results of the LPFs 302I and 302Q are sent to the baseband module 220 as the inbound baseband signals RXI and RXQ. On the contrary, when the shared filter module 210 operates in transmission mode, the switches in the selectors 310I, 320I, 310Q and 320Q conduct through the node M2, thereby the outbound baseband signals TXI and TXQ sent from the analog converter module 230 are filtered and output to the modulation module 204. The calibration unit 330, as described, tunes the bandwidths of the 302I and 302Q simultaneously with the mode switching to adopt the filter parameter requirements. Various advantages gained from the filter sharing architecture include fewer components required and costs significantly reduced. The design is further improved in the following embodiment.

Figure 4:
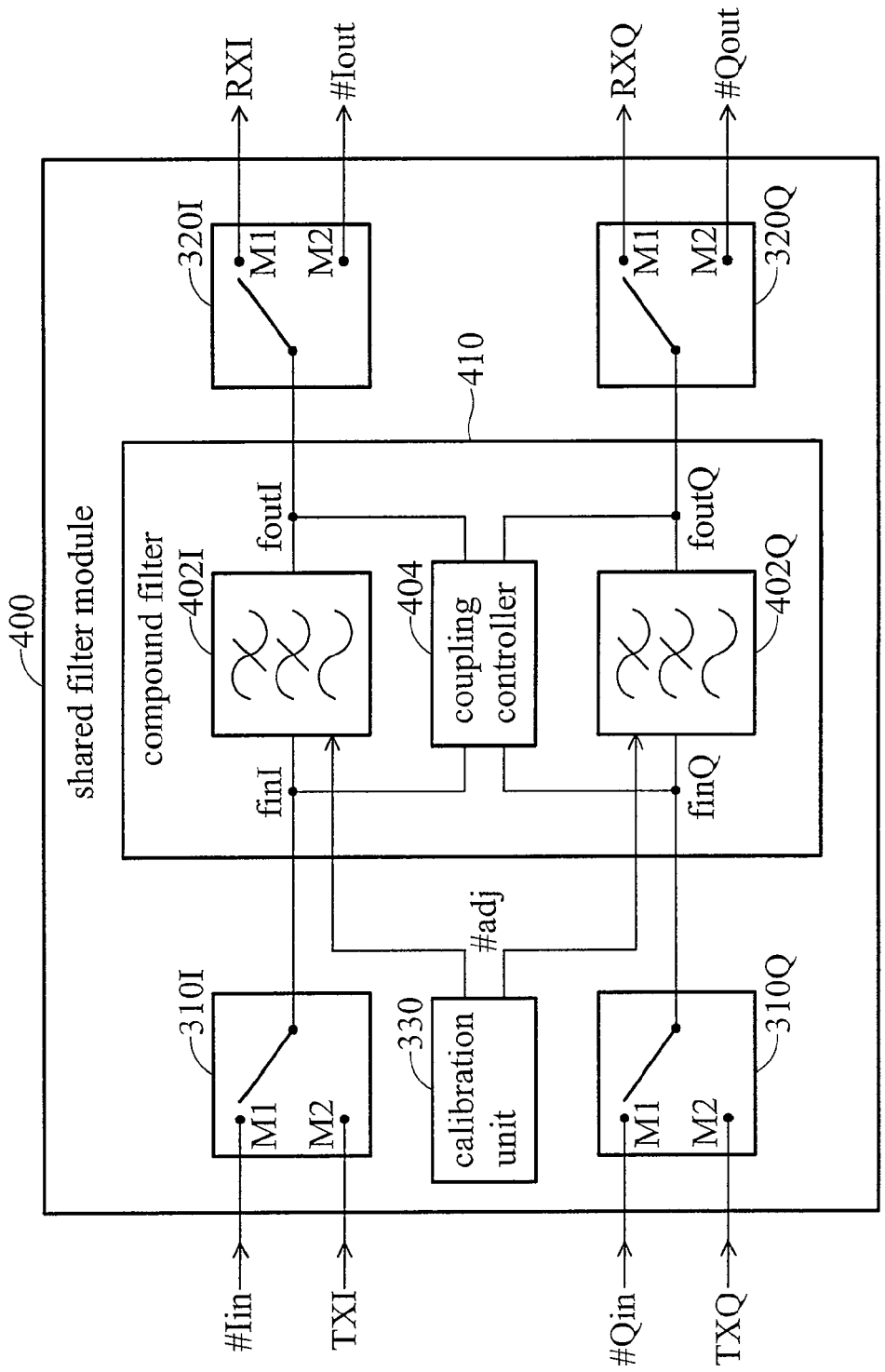
FIG. 4 shows an embodiment of a shared filter module 400 according to the current disclosure.

FIG. 4 shows an embodiment of a shared filter module 400 according to the current disclosure. The shared filter module 400 is an enhanced version of the shared filter module 210, in which the LPFs 302I and 302Q are substituted by a compound filter 410 comprising two LPFs 402I and 402Q, and a coupling controller 404. The LPFs 402I and 402Q are typically identical to the LPFs 302I and 302Q. In this embodiment, the coupling controller 404 further provides a mode dependent coupling function to render different performance. The input and output ends of the LPFs 402I and 402Q (shown as the node finI, foutI, finQ and foutQ) are wired with the coupling controller 404. When the shared filter module 400 operates in transmission mode, the coupling controller 404 is disabled, thus making the LPFs 402I and 402Q act as ordinary LPFs 302I and 302Q. While in receiver mode, however, the coupling controller 404 is enabled to couple the node finI to the node foutQ, and the node finQ to the node foutI. In this way, a cross coupling structure is established, and as a result, the compound filter 410 acts as a bandpass filter. The enhancement of compound filter 410 provides a cost effective transceiver combining a low intermediate frequency (LIF) receiver with a direct conversion (ZIF) transmitter. Additionally, the passband of compound filter 410 can be effectively adjusted by tuning the time constants of LPFs 402I and 402Q using the calibration unit 330. Therefore, any bandwidth requirement can be flexibly satisfied. In addition, it should be noted that by tuning the coupling rule of the coupling controller 404, the transmitter can also be a LIF transmitter, and the receiver can also be a ZIF receiver. Combination of the operation modes is not limited, benefiting from not only cost reduction but also flexibility for wide applications.

Figure 5:
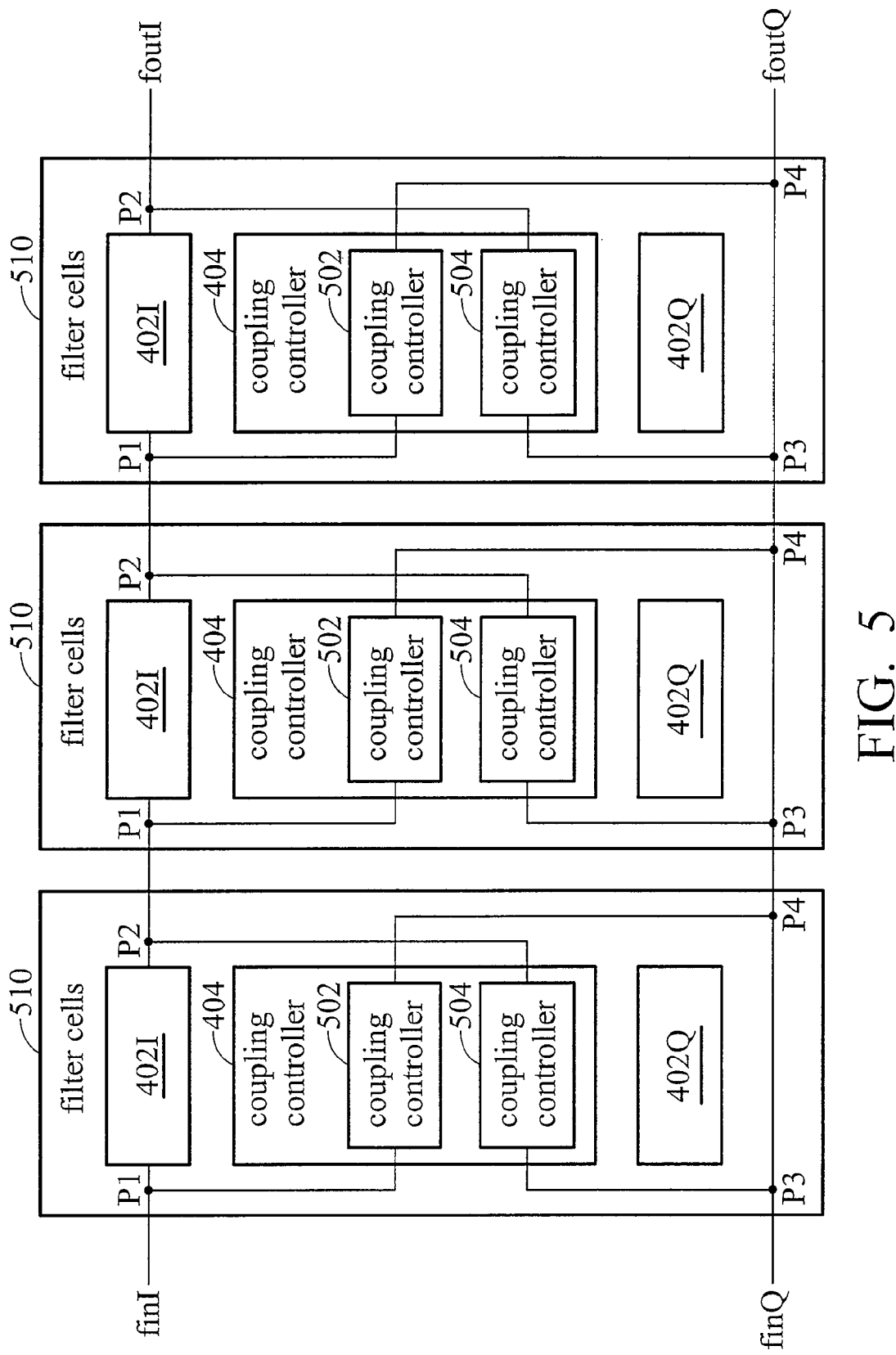
FIG. 5 shows an alternative embodiment of the compound filter 410 in FIG. 4.

FIG. 5 shows an alternative embodiment of the compound filter 410 in FIG. 4. Preferably, the compound filter 410 is a ladder structure comprising a plurality of filter cells 510 cascaded in series. Each filter cell 510 comprises two LPFs 402I and 402Q, and a coupling controller 404. The input and output nodes of the LPF 402I are P1 and P2, whereas the input and output nodes of the quadrature low pass filter 402Q are P3 and P4. The coupling controller 404 specifically comprises a first coupling controller 502 and a first coupling controller 502. The first coupling controller 502 masters the conductivity between the nodes P1 and P4, and the second coupling controller 504 controls that of the nodes P2 and P3. When the first coupling controller 502 and second coupling controller 504 are disabled, it can be seen that a total of LPFs 402I form a third order low pass filter starting at node finI and ending at node foutI, and a total of LPFs 402Q another third order low pass filter starting at node finQ and ending at node foutQ. When the transceiving system 200 operates in receiver mode, the first coupling controller 502 and second coupling controller 504 are enabled to connect their associated ends, such that the compound filter 410 acts as a bandpass filter to pass a predetermined band, and the transceiving system 200 physically acts a LIF receiver. Conversely, when the transceiving system 200 switches to transmission mode, the first coupling controller 502 and second coupling controller 504 are disabled, and the LPFs 402I and 402Q form two individual low pass filters, making the transceiving system 200 a direct conversion transmitter. For Bluetooth applications, the LPFs 402I and 402Q may be designed with bandwidths of 1.5 Mhz with center frequency 1.6 Mhz. It is noted that although not shown in FIG. 5, a preferred embodiment based on FIG. 5 may also use a calibration unit 330 to flexibly calibrate bandwidths of the LPFs 402I and 402Q to meet specific requirements.

Figure 6:
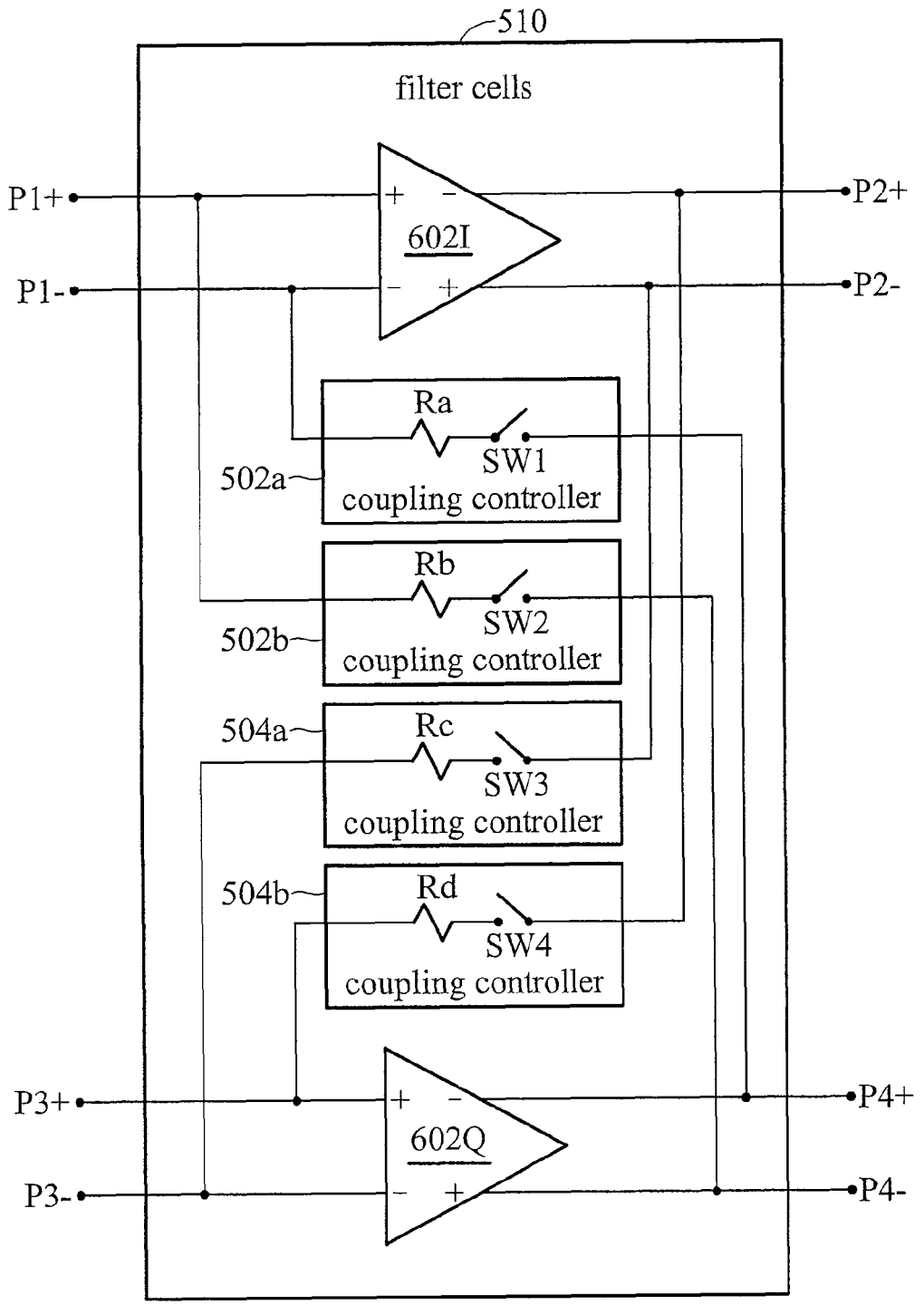
FIG. 6 shows an embodiment of a filter cell 510 according to FIG. 5.

FIG. 6 shows an embodiment of a filter cell 510 according to FIG. 5. More specifically, the LPF 402I or 402Q comprises an operational amplifier (OPA) 602I or 602Q with parameter dependent RC circuits (not shown). The input and output ends of the OPAs 602I and 602Q are differential channels marked as P1+, P1−, P2+, P2−, P3+, P3−, P4+ and P4−. When a plurality of first OPAs 602I form a ladder structure, the P2+ and P2− of a former OPA 602I are respectively coupled to the P1+ and P1− of a successive OPA 602I. Four exemplary coupling controllers 502a, 502b, 502c and 502d are provided, each coupling an inphase channel to a quadrature channel. Each coupling controller comprises a resistor and a switch. The resistors are Ra, Rb, Rc and Rd respectively, and the switches are SW1, SW2, SW3 and SW4. The first coupling controller 502a couples P1− to P4−, the second coupling controller 502b couples P1+ to P4+, the third coupling controller 504a couples P2+ to P3+, and the fourth coupling controller 504b couples P2− to P3−. The switches are synchronously turned on or off in this embodiment. When the switches are turned on, the filter cell 510 acts as a bandpass filter having bandwidth determinable by the RC time constants. When all the switches are turned off, the OPAs 602I and 602Q act as ordinary LPFs to pass a specific band determined by the RC time constants. The resistors Ra, Rb, Rc and Rd are selectable values depending on the application.

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A transceiving system capable of demodulating an inbound RF signal to inbound data and modulating outbound data to an outbound RF signal, comprising:
    a shared filter module, selectively operating in a first mode and a second mode for respectively filtering the inbound RF signal and the outbound data in a first band and a second band with a bandwidth different from the first band;
    a demodulation module, coupled to the shared filter module, wherein while in the first mode, the demodulation module demodulates the inbound RF signal into a first demodulation result, and outputs the first demodulation result to the shared filter module for filtering the first demodulation result into a first filter result of the first band;
    a baseband module, coupled to the shared filter module, wherein while in the first mode, the baseband module converts the first filter result to obtain the inbound data;
    an analog converter module, coupled to the shared filter module, wherein while in the second mode, the analog converter module converts the outbound data into an outbound baseband signal, and outputs the outbound baseband signal to the shared filter module for filtering the outbound baseband signal into a second filter result of the second band; and
    a modulation module, coupled to the shared filter module, wherein while in the second mode, the modulation module modulates the second filter result into the outbound RF signal for transmission,
    wherein the first mode is a receiving mode where the shared filter module functions as a bandpass filter and the second mode is a transmitting mode where the shared filter module functions as a low pass filter.

2. The transceiving system as claimed in claim 1, the shared filter module comprising:
    a compound filter, comprising inphase and quadrature input ends and inphase and quadrature output ends;
    an inphase input selector and a quadrature input selector, coupling the demodulation module to the inphase and quadrature input ends in the first mode, and coupling the analog converter module to the inphase and quadrature input ends in the second mode; and
    an inphase output selector and a quadrature output selector, coupling the baseband module to the inphase and quadrature output ends in the first mode, and coupling the modulation module to the inphase and quadrature output ends in the second mode.

3. The transceiving system as claimed in claim 2, wherein the compound filter comprises:
    an inphase low pass filter, having an input end coupled to the inphase input end and an output end coupled to the inphase output end;
    a quadrature low pass filter, having an input end coupled to the quadrature input end and an output end coupled to the quadrature output end;
    a coupling controller, coupling the inphase and quadrature input/output ends, wherein:
    in the first mode, the coupling controller couples the inphase input end to the quadrature output end, and couples the inphase output end to the quadrature input end, wherein the compound filter functions as a bandpass filter; and
    in the second mode, the coupling controller is disconnected, and the inphase low pass filter and the quadrature low pass filter are electronically separated, making the inphase and quadrature low pass filters work independently.

4. The transceiving system as claimed in claim 3, further comprising a calibration unit coupled to the inphase and quadrature low pass filters to calibrate the bandwidths by adjusting their RC time constants.

5. The transceiving system as claimed in claim 2, wherein the compound filter is a ladder structure comprising a plurality of filter cells cascaded in series, and each filter cell comprises:
    an inphase low pass filter, having a first input end and a first output end;
    a quadrature low pass filter, having a second input end and a second output end;

a first coupling controller, connecting the first input end to the second output end when been enabled; and a second coupling controller, connecting the second input end to the first output end when been enabled; wherein:

a first output end of a former inphase low pass filter is coupled to a first input end of a successive inphase low pass filter, whereas a second output end of a former quadrature low pass filter is coupled to a second input end of a successive quadrature low pass filter;

a first input end of a first inphase low pass filter is connected to the inphase input end, whereas a second input end of a first quadrature low pass filter is connected to the quadrature input end;

a first output end of a last inphase low pass filter is connected to the inphase output end, whereas a second output end of a last quadrature low pass filters is connected to the quadrature output end;

in the first mode, the first and second coupling controllers are enabled, and the compound filter acts as a bandpass filter; and in the second mode, the first and second coupling controllers are disabled, electronically isolating the inphase and quadrature low pass filters, making the inphase and quadrature low pass filters operate independently.

6. The transceiving system as claimed in claim 2, wherein the compound filter is a ladder structure comprising a plurality of filter cells cascaded in serial, and each filter cell comprises:

a first operational amplifier disposed on an inphase channel, comprising a pair of differential input ends and output ends;

a second operational amplifier disposed on a quadrature channel, comprising a pair of differential input ends and output ends;

a first coupling controller, associated to a negative input end of the first operational amplifier and a negative output end of the second operational amplifier;

a second coupling controller, associated to a positive input end of the first operational amplifier and a positive output end of the second operational amplifier;

a third coupling controller, associated to a positive input end of the second operational amplifier and a positive output end of the first operational amplifier;

a fourth coupling controller, associated to a negative input end of the second operational amplifier and a negative output end of the first operational amplifier; wherein:

in the first mode, the first, second, third and fourth coupling controllers are enabled, wherein the compound filter functions as a bandpass filter; and in the second mode, the first, second, third and fourth coupling controllers are disabled, electronically isolating the first and the second operational amplifiers, wherein the compound filter functions as two individual low pass filters.

7. The transceiving system as claimed in claim 6, wherein:

the first coupling controller comprises a first resistor serially cascaded with a first switch;

the second coupling controller comprises a second resistor serially cascaded with a second switch;

the third coupling controller comprises a third resistor serially cascaded with a third switch;

the fourth coupling controller comprises a fourth resistor serially cascaded with a fourth switch; and the first, second, third and fourth switches are simultaneously closed in the first mode, and opened in the second mode.

8. The transceiving system as claimed in claim 1, wherein:

the transceiving system functions as a low intermediate frequency (LIF) receiver in the receiving mode; and the second mode is a transmitting mode where the shared filter module functions as a low pass filter that passes the second band, and the transceiving system functions as a direct conversion transmitter.

9. The transceiving system as claimed in claim 1, wherein the transceiving system is used in Time Division Multiple Access (TDMA) communication systems where transmission and reception do not occur at the same time.

10. The transceiving system as claimed in claim 1, wherein the transceiving system is Wireless Local Area Network, Bluetooth or GSM system.

11. The transceiving system as claimed in claim 1, wherein the demodulation module comprises:

a low noise amplifier (LNA), receiving the inbound RF signal with amplification control;

a first mixer, mixing the inbound RF signal in an phase channel to generate inphase part of the first modulation result; and a second mixer, mixing the inbound RF signal in a quadrature channel to generate quadrature part of the first modulation result.

12. The transceiving system as claimed in claim 1, wherein the baseband module comprises:

a first variable gain amplifier (VGA), performing gain adjustment for inphase part of the first filter result;

a first analog to digital converter (ADC), coupled to the output the first VGA to generate inphase part of the inbound data;

a second VGA, performing gain adjustment for quadrature part of the first filter result; and a second ADC, coupled to the output of second VGA to generate quadrature part of the inbound data.

13. The transceiving system as claimed in claim 1, wherein:

the outbound data comprises an inphase part and a quadrature part; and the analog converter module comprises:

a first digital to analog converter (DAC), rendering inphase part of the outbound baseband signal from the inphase part of the outbound data; and a second DAC, rendering quadrature part of the outbound baseband signal from the quadrature part of the outbound data.

14. The transceiving system as claimed in claim 1, wherein the modulation module comprises:

a first up converter, for up-converting inphase part of the second filter result;

a second up converter, for up-converting quadrature part of the second filter result;

a VGA, coupled to the first and second up converters, for trimming the up converted results to generate the outbound RF signal; and a power amplifier, for amplifying the outbound RF signal and performing the transmission.

15. A transceiving system capable of demodulating an inbound RF signal to inbound data and modulating outbound data to an outbound RF signal, comprising:

a demodulation module, demodulating the inbound RF signal into a demodulation result in a first mode;

an analog converter module, converting the outbound data into an outbound baseband signal in a second mode;

a shared filter module, selectively operating in the first mode where the shared filter functions as a bandpass filter and the second mode where the shared filter functions as a low pass filter for respectively filtering the demodulation result and the outbound baseband signal into a first filter result of a first band and a second filter result of a second band with a bandwidth different from the first band;

a baseband module, converting the first filter result to obtain the inbound data in the first mode; and a modulation module, modulating the second filter result into the outbound RF signal in the second mode, wherein the shared filter module comprises:

a compound filter, comprising inphase and quadrature input ends and inphase and quadrature output ends, wherein the inphase input end is coupled to the quadrature output end and the inphase output end is coupled to the quadrature input end in the first mode;

an inphase input selector and a quadrature input selector, coupling the demodulation module to the inphase and quadrature input ends in the first mode, and coupling the analog converter module to the inphase and quadrature input ends in the second mode; and an inphase output selector and a quadrature output selector, coupling the baseband module to the inphase and quadrature output ends in the first mode, and coupling the modulation module to the inphase and quadrature output ends in the second mode.

16. The transceiving system as claimed in claim 15, wherein the compound filter comprises:

an inphase low pass filter, having an input end coupled to the inphase input end and an output end coupled to the inphase output end;

a quadrature low pass filter, having an input end coupled to the quadrature input end and an output end coupled to the quadrature output end; and a coupling controller, coupling the inphase and quadrature input/output ends, wherein:

in the first mode, the coupling controller couples the inphase input end to the quadrature output end, and couples the inphase output end to the quadrature input end, and the compound filter functions as a bandpass filter; and in the second mode, the coupling controller is disconnected, and the inphase low pass filter and the quadrature low pass filter are electronically separated, making the inphase and quadrature low pass filters work independently.

17. The transceiving system as claimed in claim 16, wherein the shared filter module further comprises a calibration unit coupled to the inphase and quadrature low pass filters to calibrate the bandwidths by adjusting their RC time constants.

18. The transceiving system as claimed in claim 15, wherein the compound filter is a ladder structure comprising a plurality of filter cells cascaded in series, and each filter cell comprises:

an inphase low pass filter, having a first input end and a first output end;

a quadrature low pass filter, having a second input end and a second output end;

a first coupling controller, connecting the first input end to the second output end when been enabled; and a second coupling controller, connecting the second input end to the first output end when been enabled; wherein:

a first output end of a former inphase low pass filter is coupled to a first input end of a successive inphase low pass filter, whereas a second output end of a former quadrature low pass filter is coupled to a second input end of a successive quadrature low pass filter;

a first input end of a first inphase low pass filter is connected to the inphase input end, whereas a second input end of a first quadrature low pass filter is connected to the quadrature input end;

a first output end of a last inphase low pass filter is connected to the inphase output end, whereas a second output end of a last quadrature low pass filters is connected to the quadrature output end;

in the first mode, the first and second coupling controllers are enabled such that the inphase input end is coupled to the quadrature output end and the inphase output end is coupled to the quadrature input end, and the compound filter acts as a bandpass filter; and in the second mode, the first and second coupling controllers are disabled, electronically isolating the inphase and quadrature low pass filters, making the inphase and quadrature low pass filters operate independently.

19. The transceiving system as claimed in claim 15, wherein the compound filter is a ladder structure comprising a plurality of filter cells cascaded in serial, and each filter cell comprises:

a first operational amplifier disposed on an inphase channel, comprising a pair of differential input ends and output ends;

a second operational amplifier disposed on a quadrature channel, comprising a pair of differential input ends and output ends;

a first coupling controller, associated to a negative input end of the first operational amplifier and a negative output end of the second operational amplifier;

a second coupling controller, associated to a positive input end of the first operational amplifier and a positive output end of the second operational amplifier;

a third coupling controller, associated to a positive input end of the second operational amplifier and a positive output end of the first operational amplifier;

a fourth coupling controller, associated to a negative input end of the second operational amplifier and a negative output end of the first operational amplifier; wherein:

in the first mode, the first, second, third and fourth coupling controllers are enabled such that the inphase input end is coupled to the quadrature output end and the inphase output end is coupled to the quadrature input end, and the compound filter functions as a bandpass filter; and in the second mode, the first, second, third and fourth coupling controllers are disabled, electronically isolating the first and the second operational amplifiers, wherein the compound filter functions as two individual low pass filters.

20. The transceiving system as claimed in claim 19, wherein:

the first coupling controller comprises a first resistor serially cascaded with a first switch;

the second coupling controller comprises a second resistor serially cascaded with a second switch;

the third coupling controller comprises a third resistor serially cascaded with a third switch;

the fourth coupling controller comprises a fourth resistor serially cascaded with a fourth switch; and the first, second, third and fourth switches are simultaneously closed in the first mode, and opened in the second mode.

21. The transceiving system as claimed in claim 15, wherein:

the first mode is a receiving mode where the shared filter module functions as a bandpass filter, and the transceiving system functions as a low intermediate frequency (LIF) receiver; and the second mode is a transmitting mode where the shared filter module functions as a low pass filter that passes the second band, and the transceiving system functions as a direct conversion transmitter.

* * * * *